United States Patent [19]

Reingold

[11] Patent Number: 4,777,382
[45] Date of Patent: Oct. 11, 1988

[54] PULSE WIDTH LOGIC/POWER ISOLATION CIRCUIT

[75] Inventor: Phillip S. Reingold, Tucson, Ariz.

[73] Assignee: Allied-Signal, Inc., Morris Township, Morris County, N.J.

[21] Appl. No.: 64,905

[22] Filed: Jun. 19, 1987

[51] Int. Cl.⁴ ............................................. H03K 5/00
[52] U.S. Cl. ..................................... 307/106; 307/34; 307/107; 318/678; 318/681; 318/254; 318/599; 363/41
[58] Field of Search ................... 307/7, 106, 107, 108, 307/109, 419, 412, 413, 414, 415, 416, 417, 418, 420, 421, 282, 265, 266, 267, 268, 595; 318/503, 439, 605, 606, 608, 678, 681, 762, 701, 721, 798, 599, 802, 800, 803, 805, 806, 808, 810, 811, 812, 254, 138, 621; 363/41, 28, 124, 126, 46, 48, 87, 59, 43, 96, 98; 328/58, 65

[56] References Cited

U.S. PATENT DOCUMENTS

| 2,570,014 | 10/1951 | Schenau et al. | 363/59 X |
|---|---|---|---|
| 2,994,840 | 8/1961 | Dorsman . | |
| 3,143,664 | 8/1964 | Lourie et al. . | |
| 3,204,121 | 8/1965 | Riley . | |
| 3,205,424 | 9/1965 | Bates | 307/106 X |
| 3,217,173 | 11/1965 | Strohmeier . | |
| 3,221,183 | 11/1965 | White . | |
| 3,284,647 | 11/1966 | Chausse . | |
| 3,307,091 | 2/1967 | Johannes | 318/254 X |
| 3,308,370 | 3/1967 | Britten et al. . | |
| 3,350,569 | 10/1967 | Beck et al. . | |
| 3,436,644 | 4/1969 | Murray et al. | 363/97 |
| 3,571,688 | 3/1971 | Tomasulo | 318/681 X |
| 3,601,677 | 8/1971 | MacDavid | 318/678 |
| 3,609,490 | 9/1971 | Keranen | 318/807 |
| 3,686,557 | 8/1972 | Futamura | 318/599 |
| 3,743,924 | 7/1973 | Genuit et al. | 307/34 X |
| 3,959,669 | 5/1976 | Peters . | |
| 3,959,711 | 5/1976 | Greenhalgh | 363/41 |
| 4,021,685 | 5/1977 | Goodall et al. . | |
| 4,052,623 | 10/1977 | Loberg . | |
| 4,067,057 | 1/1978 | Taddeo et al. | 363/41 |
| 4,068,135 | 1/1978 | Sonobe et al. . | |
| 4,370,702 | 1/1983 | Shuey et al. | 363/98 X |
| 4,721,863 | 1/1988 | Bercy | 363/124 X |

Primary Examiner—William M. Shoop, Jr.
Assistant Examiner—Paul Ip
Attorney, Agent, or Firm—Curtis L. Harrington; David B. Abel

[57] ABSTRACT

A circuit is disclosed which provides power isolation between the initializing and driven circuit, allowing the logic of a wide pulse width signal to be effectively transmitted across pulse transformers and faithfully reproduced.

19 Claims, 4 Drawing Sheets

PULSE WIDTH LOGIC/POWER ISOLATION CIRCUIT

This invention was made with government support under Contract No. F29601-85-0108, awarded by the U.S. Air Force. The Government has certain rights in this invention.

BACKGROUND OF THE INVENTION

This invention relates generally to a circuit and a method for coupling a variable width pulse through a pulse transformer to allow all of the information in the incoming signal to be successfully transmitted across transformer couplings for use in driving other equipment. The invention is especially useful for powering a brushless motor commutation circuit.

The need has long existed for a better, less expensive way in which to drive a switching, or driver circuit without having the relatively lower current or voltage of the control circuit become affected by the relatively larger current or higher voltage in the driver circuit (i.e. isolation). One solution to this problem has been to use opto-isolators. This scheme generally involves the illumination of a light source by the control circuit, and the reception of light radiation from the light source by an optical relay in the driver circuit. In this manner, since the only connection between the two circuits consists of a radiative light, the current and voltage levels of the two circuits could be grossly dissimilar without the possibility of the voltage and current of one becoming affected by the voltage or current of the other.

The main problem with the opto-isolator scheme, is its susceptibility to extraneous electromagnetic interference. Electromagnetic interference can arise via unwanted conduction, induction, or radiation from unexpected sources outside the circuit. The need for circuitry designs specifically resistive to electromagnetic interference has been so great as to have created a specialty within the electronic arts. However, a light sensor suitable for the aforementioned optical coupling must, of necessity, be sensitive to and, therefore, easily interferable by electromagnetic interference. In space satellite applications where the radiation levels are high the interference is more severe. In addition, the cost of optoisolators tends to add significantly to the cost of circuit design.

SUMMARY OF THE INVENTION

The circuit of the present invention accomplishes the method of pulse width signal transmission with the appropriate isolation. The present invention allows transformers to be used as a barrier isolating the voltage and current of one side of a circuit from the voltage and current of the other side. The duration of incoming signals are faithfully reproduced downstream of the isolation circuit. The output pulse can be made to assume the value of any voltage sources available.

Generally, the circuit contains a pulse generation circuit which receives an incoming pulse and transmits short duration pulses representing the logic of the voltage potential level of the incoming pulse. The short duration pulses are sent across transformers to the switching circuit. The switching circuit uses the short duration pulse to reconstruct the duration of the original incoming pulse.

The circuit of the present invention is more resistive to the effects of electromagnetic interference than an optoisolator circuit. Since the present circuit uses only ordinary components, namely zener diodes, diodes, transistors and resistors, it can be produced much more cheaply than a circuit utilizing opto-isolators. The response of the present circuit will equal or exceed that of the opto-isolator scheme previously discussed.

BRIEF DESCRIPTION OF THE DRAWINGS

Further advantages of the invention will become apparent from the following description and claims, and from the accompanying drawings wherein:

DESCRIPTION OF THE PREFERRED EMBODIMENT

Figure 1:
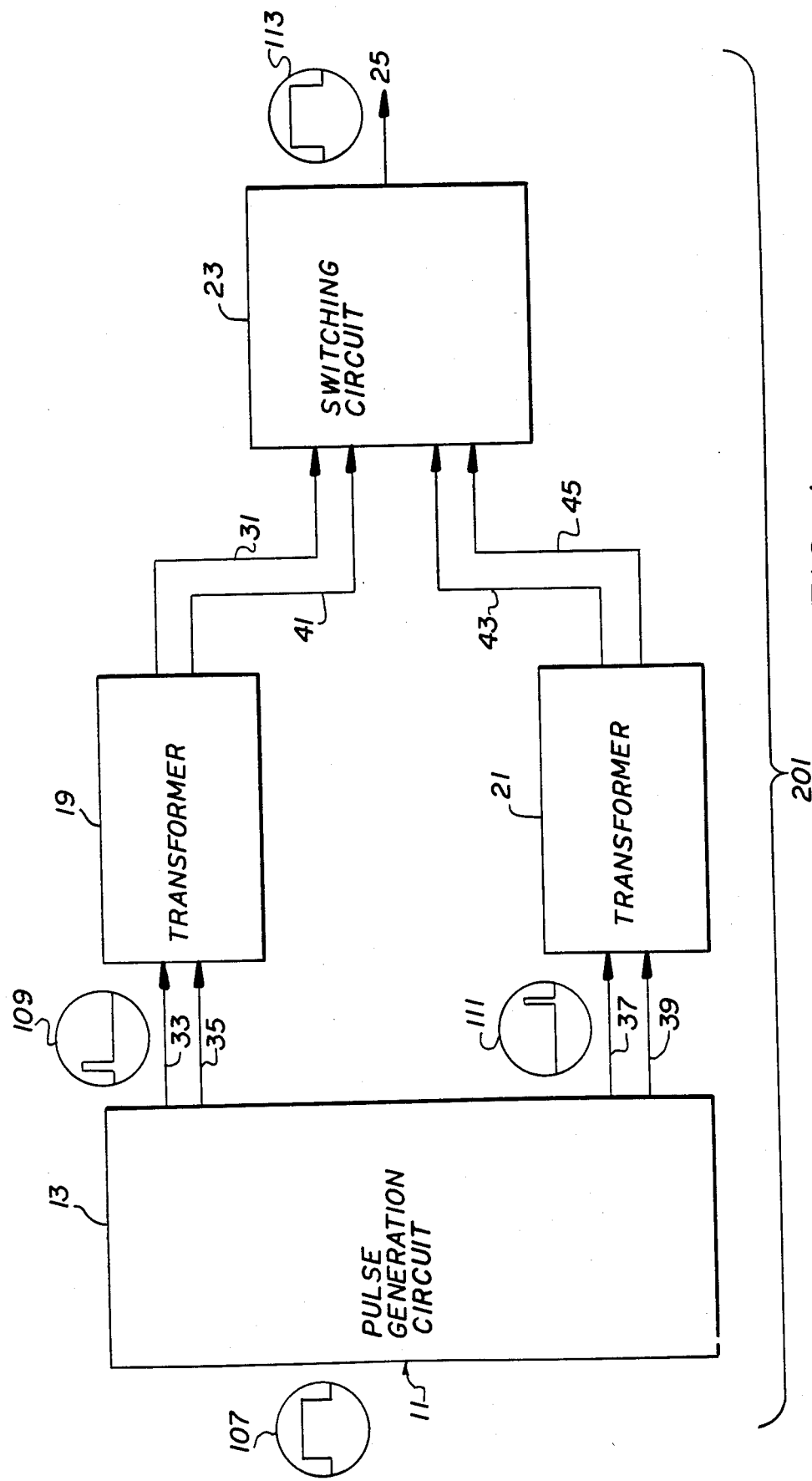
FIG. 1 is a simplified block diagram of the circuit of the present invention.

Referring to FIG. 1, the simplified block diagram of the variable pulse width power isolation circuit, generally designated as 201, is illustrated. A varying pulse width signal 11, represented by 107, is received by a pulse generation circuit 13. Pulse generation circuit 13 produces and transmits a short duration pulse, represented by 109, to indicate an "on" condition. The pulse travels through the leads 33 and 35, through a pulse transformer 19, and then through a pair of leads 31 and 41. This occurs when the varying pulse width signal 11 goes from a lower to a higher voltage. Pulse generation circuit 13 will produce and transmit a short duration pulse, represented by 111, to indicate an "off" condition. This pulse travels through a pair of leads 37 and 39, through a pulse transformer 21, and then through a pair of leads 43 and 45. This occurs when the varying pulse width signal 11 goes from a higher to a lower voltage. The typical varying pulse width signal 11 is, in this case a relatively wide pulse represented at 107, to show contrast with representations 109 and 111. It can be a train of pulses as represented at 107, or a single pulse. Note that the short duration pulse represented at in 109 occurs early to correspond with the transition from lower voltage to high voltage of varying pulse width signal 11 shown in representation 107. Similarly, note that the short duration pulse represented in 111 occurs late to correspond with the transition from higher to lower voltage of varying pulse width signal 11 shown in representation 107. The short duration pulses are unipolar pulses. Transformers 19 and 21 link the short duration pulses to circuit 23.

The transformers 19 and 21 provide ioslation by inductive linking. The problem with using transformers alone to link pulse signals is the fact that a transformer can only transmit a signal while the signal's voltage potential is changing. If a signal pulse which has a long pulse duration is attempted to be transmitted across a transformer, the output will initially become energized as the input signal is increasing, but as the input signal levels off to remain constant, the output will fall to approach zero very rapidly. Thus, even though a constant high voltage level is indicated in the input, a low or near zero voltage level will appear at the output. So, when trying to link a series of longer duration pulses across the transformer, voltage potential from only the first portion of the pulse is effectively transferred across the transformer.

Therefore, the use of a relatively short duration pulses to signal both the transition from low to high voltage potential and high to low voltage potential of the incoming signal allows transformers to be used for isolation, but without having to be concerned with the duration of the originating variable width pulse 11.

A switching circuit 23 uses a short duration unipolar pulse from transformer 19 to switch on output 25 of the isolation circuit. Upon receiving a short duration unipolar pulse from transformer 21, switching circuit 23 shuts off or deenergizes an output 25 of isolation circuit 23.

The short duration pulses can occur very rapidly to produce representation 113 of output 25. Representation 113 illustrates isolation circuit 23 producing a relatively long duration pulse. In this manner, transformers may be used to link a variable pulse width signal from one isolated circuit to another, without the concomitant transformer limitations, such as saturation, in faithfully reproducing the input signal.

It is clear that pulse generation circuit 13 could produce a pulse of any width through transformer 19 or 21 to turn switching circuit 23 on or off, respectively. However, the best mode of practicing the invention dictates that pulse generation circuit 13 produce pulses of short duration to save energy. The pulse received by switching circuit 23 must only be of sufficient magnitude and duration to allow switching circuit 23 to operate. The force which links the input side to the output side of each transformer 19, 21 is magnetic inductance. The windings of transformers 19 and 21 are used to couple a signal in their primary winding, referenced to signal ground, to their secondary winding whose DC level is tied to a much higher voltage at the output. The signal waveform shown in representation 113 can thus have any desired voltage magnitude. The voltage potential characteristics of switching circuit 23 will, of course, depend upon the requirements of the type of device connected to output 25.

Figure 2:
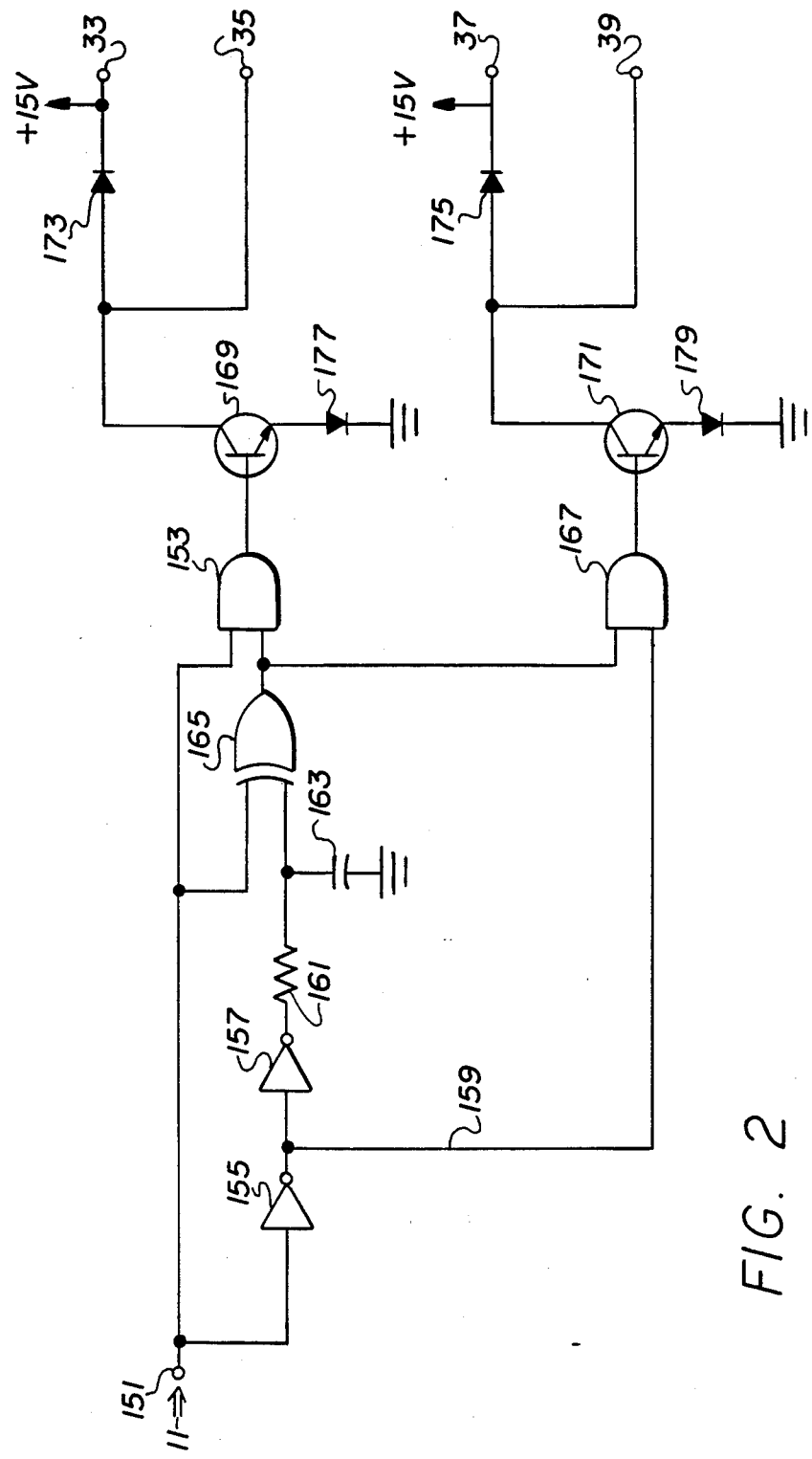
FIG. 2 is a detailed schematic of the pulse generation current of FIG. 1.

Referring to FIG. 2, a detailed schematic of the pulse generation circuit 13 is illustrated. It is this circuit which receives the variable width pulse 11, and generates short duration pulses in response thereto. A terminal 151 is illustrated ready to receive variable width pulse 11. Terminal 151 is connected to the input of an inverting gate 155. The output of inverting gate 155 is connected to the input of another inverting gate 157. The output of inverting gate 155 is connected to one of two inputs of an AND gate 167.

The output of inverting gate 157 is connected to one end of a resistor 161 which has a resistive value of 3,300 ohms. The other end of resistor 161 is connected to one side of a capacitor 163 which has a capacitive value of 3,900 picofarads. The other side of capacitor 163 is grounded. The other end of resistor 161 is also connected to one of two inputs of an XOR (Exclusive OR) gate 165. The other input of XOR gate 165 is connected to terminal 151. The output of XOR gate 165 is connected to the other input of AND gate 167. The output of XOR gate 165 is also connected to one of two inputs of an AND gate 153. The other input of AND gate 153 is connected to terminal 151.

The output of AND gate 153 is connected to the base of an NPN transistor 169. The emitter of transistor 169 is connected to one end of a diode 177. The other end of diode 177 is connected to ground. Diode 177 is oriented to permit current flow away from the emitter of transistor 169. The collector of transistor 169 is connected to one end of a diode 173. The other end of diode 173 is connected both to a positive voltage source having a potential of fifteen volts, and to a lead 33. The collector of transistor 169 is also connected to a lead 35.

Similarly, the output of AND gate 167 is connected to the base of an NPN transistor 171. The emitter of transistor 171 is connected to one end of a diode 179. The other end of diode 179 is connected to ground. Diode 179 is oriented to permit current flow away from the emitter of transistor 171. The collector of transistor 171 is connected to one end of a diode 175. The other end of diode 175 is connected both to a positive voltage source having a potential of fifteen volts, and to a lead 33. The collector of transistor 171 is also connected to a lead 39.

Figure 3:
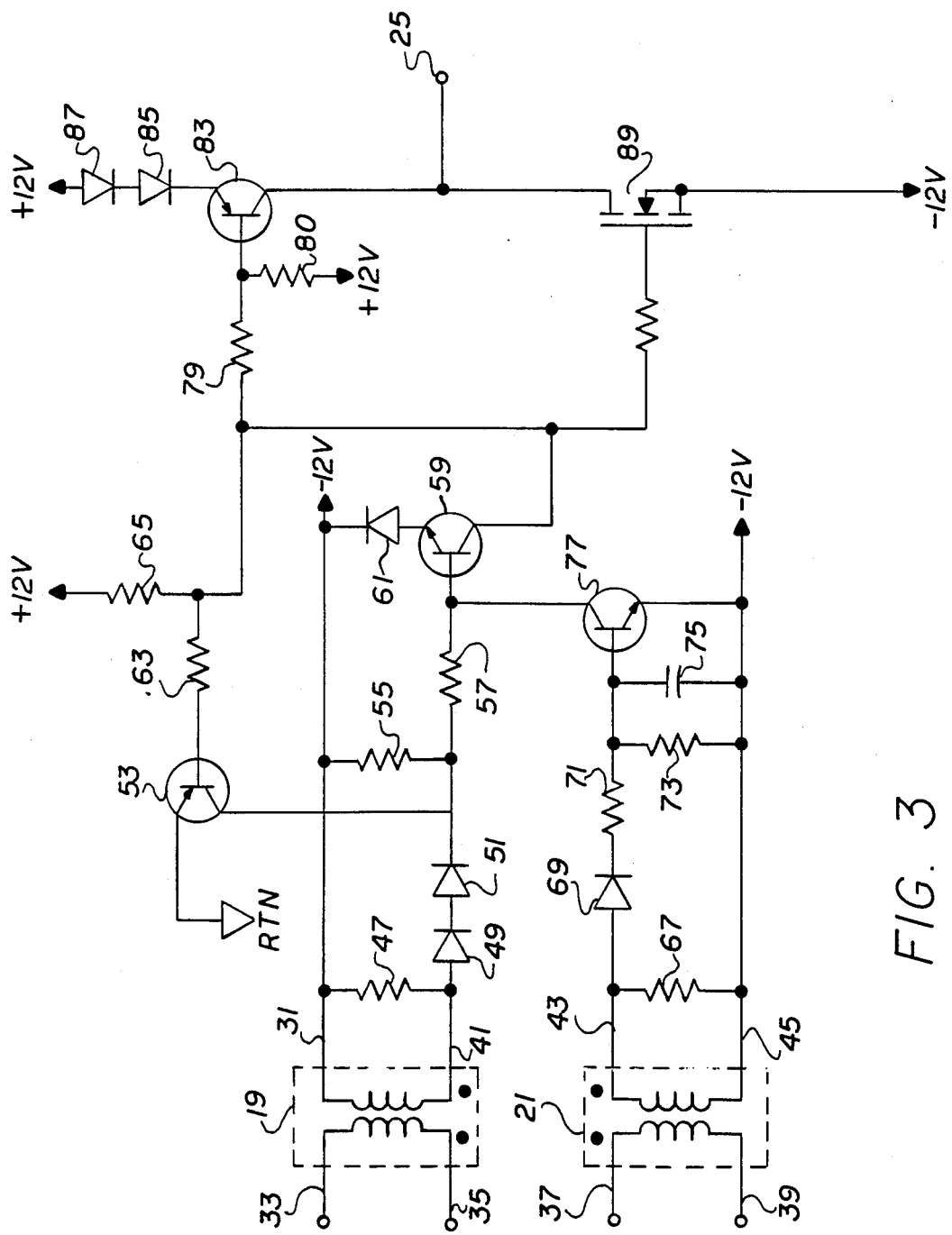
FIG. 3 is a detailed schematic of the transformers and switching circuit illustrated in FIG. 1.

Referring to FIG. 3, a detailed schematic of the transformers 19 and 21 and switching circuit 23 is illustrated. Transformer 19 has leads 33 and 35 to input, and leads 31 and 41 to output. Leads 33, 35, 37 and 39 of FIG. 3 correspond to those previously shown on FIG. 2. Leads 35 and 41 are designated as the dotted leads. This means that current flowing into lead 35 will produce a resulting current flowing into lead 41 on the other side of transformer 19. Likewise, transformer 21 has input leads 37 and 39 and output leads 43 and 45. Leads 37 and 43 are the dotted leads for transformer 31.

Although connected to pulse generation circuit of FIG. 2, it is understood that the input leads 33 35 of transformer 19 are suitable for connection to any device which will generate one or more unipolar pulses. Leads 31 and 41 of transformer 19 are shunted b a resistor 47, which has a resistive value of 4,700 ohms. Lead 41 of transformer 19 is attached to one end of a series connected pair of diodes 49 and 51. The other end of the series pair of connected diodes 49 and 51 is connected to the collector of a latch transistor 53. The emitter of PNP latch transistor 53 is connected to ground. Series connected diodes 49 and 51 are oriented to allow current flow away from lead 41 of transformer 29. A resistor 55, which has a resistive value of 1,500 ohms, has one end connected to the current output side of diode 51 and the other end connected to lead 39 of transformer 19. Also connected to the output of diode 51 is a resistor 57 which has a resistive value of 4,120 ohms. The other side of resistor 57 is connected to the base of an NPN transistor 59. The emitter of transistor 59 is connected to a diode 61. Diode 61 is oriented to allow current flow away from transistor 59. The other side of diode 61 is connected to lead 39 of transformer 1. Lead 39 of transformer 19 is attached to a negative voltage source having a potential of negative 12 volts.

Returning to the latching transistor 53, its base is connected to a resistor 63, which has a resistive value of 18,200 ohms. The other side of resistor 63 is connected to the collector of transistor 59. The other side of resistor 63 is also connected to a resistor 65 which has a resistive value of 619 ohms. The other end of resistor 65 is connected to a positive voltage source having a positive 12 volt potential.

Referring to transformer 21, the output leads 43 and 45 are shunted by a resistor 67 which has a resistive value of 4,700 ohms. Lead 43 of transformer 21 is connected to one side of a diode 69. Diode 69 is oriented to allow current flow from terminal 43 of transformer 31. The other side of diode 69 is connected to a resistor 71 which has a resistive value of 10,100 ohms. The other side of resistor 71 is connected to one side of a resistor 73 which has a resistive value of 4,300 ohms. The other side of resistor 73 is connected to lead 45 of transformer 31. Capacitor 75 shunts resistor 73 and has a rating of 100 volts and a capacitive value of 1000 picofarads. The side of resistor 71 opposite diode 69, is connected to the base of NPN transistor 77. The emitter of transistor 77 is connected to lead 45 of transformer 21. The collector of transistor 77 is connected to the base of transistor 59. The lead 45 of transformer 31 is also connected to a negative voltage source having a potential of negative 12 volts.

The collector of transistor 59 is also connected to a resistor 79 which has a resistive value of 620 ohms. The other side of resistor 79 is connected to the base of a transistor 83. The other side of resistor 79 is also connected to one side of a resistor 80 which has a resistive value of 620 ohms. The other side of resistor 80 is connected to a positive voltage source having a positive 12 volt potential. The emitter of transistor 83 is connected to a pair of series connected diodes 85 and 87. The other end of the series connected diodes 85 and 87 is connected to a positive voltage source which has a potential of 12 volts. The diodes 85 and 87 are oriented to allow current flow into and through transitor 83. The collector of transistor 83 is connected to the drain of a transistor 89, a field effect transistor. The gate of transistor 89 is connected to the collector of transistor 59. The source of transistor 89 is connected to a negative voltage source, having a potential of negative 12 volts.

The connection between transistor 83 and 89 will, depending on their respective open or closed states, allow, due to the posiive and negative 12 volt sources, a positive or negative 12 volt potential to exist between them. Voltage sources having other potentials, with transistors 83 and 89 selected to handle those potentials, could be used to allow expansion of the values of potentials achievable between the two transistors. Depending on the use sought to be employed, the circuit could be deemed complete at this point and the connection between the drain of transistor 89 and the collector of transistor 83 would form output 25 in the form of a square wave whose maximum potential would be positive 12 volts and whose minimum potential would be negative 12 volts. If, for example, a grounded potential were substituted for the negative 12 volt potential connected to the source of transistor 89, a unipolar squarewave pulse, as illustrated in representation 113 of FIG. 1, would be the output 25. This completes the detailed description of the variable pulse width power isolation circuit designated generally as 201 in FIG. 1.

Figure 4:
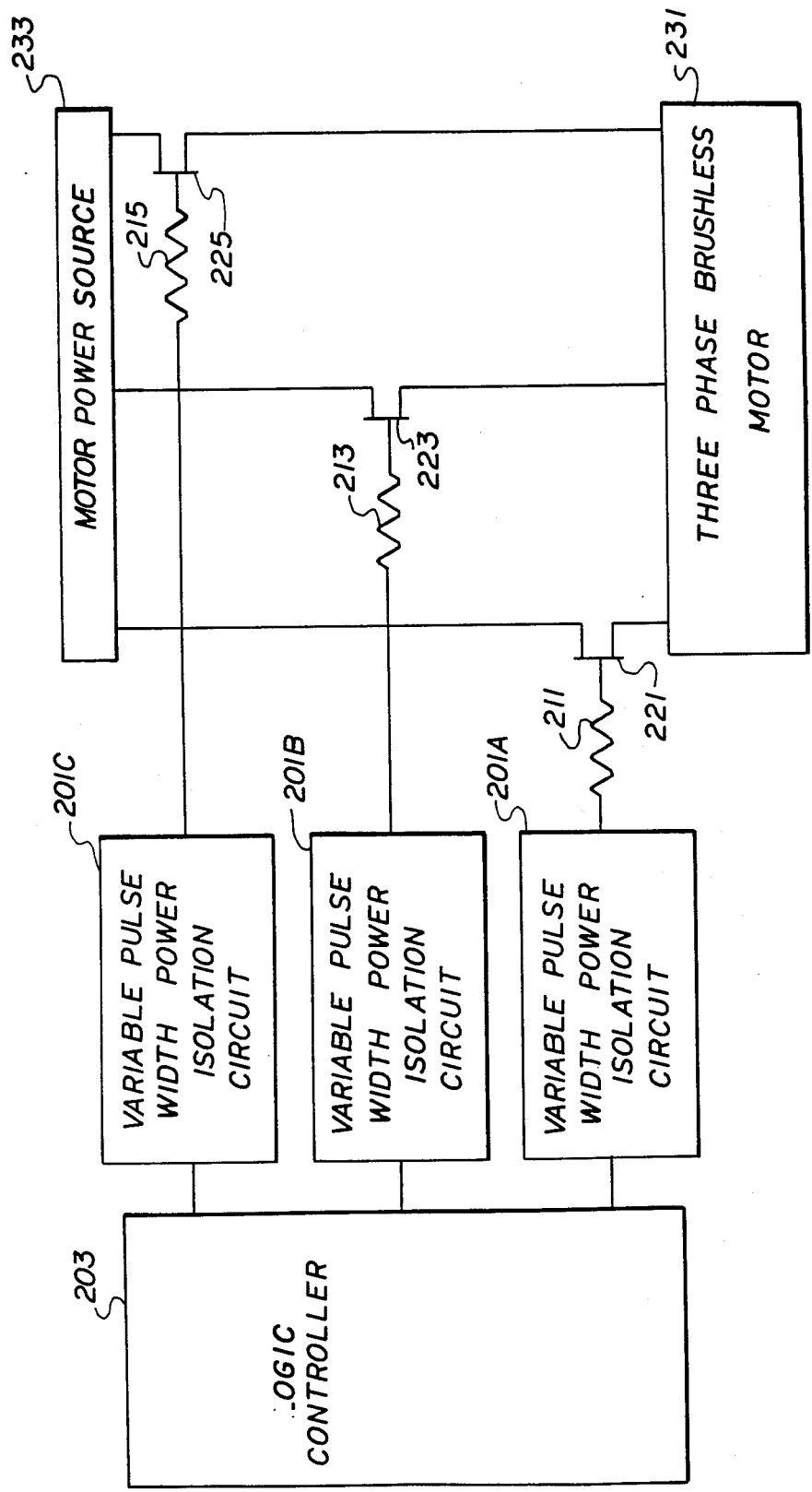
FIG. 4 is a block diagram/schematic of the present application used in a system to drive a three phase brushless motor.

Referring to FIG. 4, the use of the variable pulse width power isolation circuit 201 of the present invention for three phase commutation is illustrated. A logic controller 203 is illustrated and may be any type of digital computational device such as a computer or microprocessor. Typically, the logic of these devices operates at a positive voltage potential of about five volts. This voltage level is sufficient to drive the variable pulse width power isolation circuit 201 as previously described. It is understood, however, that variable pulse width power isolation circuit 201 can be designed to handle lower or higher voltage inputs, and still produce a lower or higher voltage output than that previously described, depending on the values of the circuit components selected.

The logic controller 203 has three identical variable pulse width power isolation circuits 201 connected to it to enable logic controller 203 to selectively deliver a variable width five volt pulse to each of the variable width power isolation circuits 201. The variable pulse width power isolation circuits shown in FIG. 4 are labeled 201a, 201b, and 201c only for clarity of explanation, since they are identical.

Variable pulse width power isolation circuit 201a is connected to one end of a resistor 211. The other end of resistor 211 is connected to the gate of a field effect transistor 221. The drain of field effect transistor 221 is connected to a motor power source 233. Motor power source 233 provides a continuously available source of direct current power. The source of field effect transistor 221 is connected to one of the windings of a three phase brushless motor 231.

Variable pulse width power isolation circuit 201b is connected to one end of a resistor 213. The other end of resistor 213 is connected to the gate of a field effect transistor 223. The drain of field effect transistor 223 is connected to motor power source 233. The source of field effect transistor 223 is connected to one of the windings of three phase brushless motor 231 not connected to the source of field effect transistor 221.

Variable pulse width power isoaltion circuit 201c is connected to one end of a resistor 215. The other end of resistor 215 is connected to the gate of a field effect transistor 225. The drain of field effect transistor 225 is connected to motor power source 233. The source of field effect transistor 225 is connected to the winding of three phase brushless motor 231 not connected to the sources of field effect transistors 221 or 223.

Therefore, each of the sources of the field effect transistors 221, 223, 225 is connected to a separate winding of three phase brushless motor 231. It is understood that field effect transistors 211, 213, 215 represent the idea of charge actuated switches and each may exist as a number of parallel connected field effect transistors which jointly and simultaneously handle the current flow from motor power source 233 to a single winding of three phase brushless motor 231. In the block diagram of FIG. 4, the logic controller 203 is enabled to operate the three phase brushless motor 231, as will later be described in a section herein on circuit operation.

In describing circuit operation, we begin by referring to FIG. 1. Beginning with output 25 in the un-energized postiion, the variable pulse width power isolation circuit 201 is ready and waiting for its first pulse signal. Now referring to FIG. 2, a variable width pulse 11, typically having a five volt potential, is received at terminal 151. As the pulse arrives, terminal 151 immediately assumes the maximum potential of the incoming pulse. This sets the input of AND gate 153 at a positive potential. Inverting gate 155 inverts the positive potential received at its input to a zero potential at its output. This zero potential is also made available into the input of AND gate 167. This zero potential insures suppression of a positive output from AND gate 167 while a positive potential is being received at terminal 151.

Zero voltage potential from the output of inverting gate 155 is received at the input of inverting gate 157. This caues inverting gate 157 to invert the zero potential received at its input, to a positive potential, equivalent to that initially received at the input of inverting gate 155. The positive potential at the output of inverting gate 157 causes current to flow across resistor 161 and into capacitor 163 causing it to begin charging over time. It is important to note that a positive potential at terminal 151 is immediately available to the input of XOR 165. Due to the charging of capacitor 163, however, the other input of XOR 165 is unenergized for a short time after the first input of XOR 165 is energized. An XOR (Exclusive OR) gate produces a positive output potential when one and only one of its inputs is energized. It can be either input, but not both. This distinguishes it from a conventional OR which produces a positive output potential when either or both of its intputs are energized. Therefore, as soon as terminal 151 assumes a positive potential, so does only one XOR gate 165 input. Since the other XOR gate 165 input is at zero potential and remains so until capacitor 163 is fully charged, the output XOR gate 165 quickly assumes a positive potential. The output of XOR gate 165 is connected to one input of AND gate 153, and the other input of AND gate 153 is connected to terminal 151, and therefore both inputs of AND gate 153 assume a positive potential simultaneously with the positive potential received at terminal 151. This causes the output of and gate 153 to assume a positive potential, thus opening transistor 169.

Transistor 169 accepts current from lead 35, through the collector of transistor 169. Transistor 169 passes current through transistor 177 to ground. Leads 33 and 35 are connected to transformer 19 shown in FIG. 3. The current from lead 35 comes from transformer 19, which in turn comes from the positive fifteen voltage source into lead 33 as shown in FIG. 2. It is transistor 169 which switches to produce the short duration pulse into transformer 19.

A very short time after the output of XOR gate 165 assumed a positive potential, capacitor 163 begins to charge. It charges quickly to bring the input terminal of XOR gate 165, to which it is connected, to a positive potential. Assuming that terminal 151 is still experiencing the positive voltage potential from the variable pulse width input pulse, when capacitor 163 fully charges, the inputs to XOR gate 165 will both have a positive potential which will cause the output of XOR gate 165 to assume a zero potential. At that time AND gate 153 will have only one input at a positive voltage value because of its connection to terminal 151 and the other input at a zero votage value from the output of XOR gate 165. This will cause a zero potential at the output of AND gate 153 and therefore a zero potential at the base of transistor 169 to which it is connected. This shuts off transistor 169 a short time after it was turned on thus producing a pulse of short duration across leads 33 and 35.

In the event that the variable pulse width pulse 11 is short enough to reassume a zero potential before capacitor 163 is fully charged, one input of AND gate 153 will, because of its connection with terminal 151, assume a zero potential. This will also cause the output of AND gate 165 to assume a zero potential thus causing the base of transistor 169 to assume a zero potential, thus shutting it off. We therefore see that a pulse of a given duration at terminal 151 will produce a pulse across leads 33 and 35 which has a maximum duration, limited by the charging time of capacitor 163. We also see that if a pulse is received at termimal 151 which is of shorter duration than the charging time of capacitor 163, then a correspondingly shorter pulse will be produced across leads 33 and 35. Therefore, under operating conditions, the pulse across leads 33 and 35 will be at maximum be a short duration pulse, but it can be shorter, as short of a duration as that received at terminal 151. This is important because it will prevent transistor 169 from being turned on while transistor 171 is on.

Assuming a long duration input pulse, presently continuing and with enough elapsed time for the short duration pulse to have been produced across leads 33 and 35, the variable pulse width power isolation circuit 201 is in an equilibrium state. The output of XOR gate 165 is at zero potential. One input of AND gate 167 is negative from the output of inverting gate 155, while the other is zero potential because of its connection to the output of XOR gate 165. Therefore, both transistors 169 and 171 are off. A long duration pulse is used for discussion purposes at the terminal 151 for illustration of the status of the circuit element after the beginning of the pulse is received, but before it ends.

At the end of the long duration pulse at terminal 151, terminal 151 immediately assumes a zero potential. Since one input of XOR gate 165 is connected to terminal 151, it also assumes a zero potential. However, a short time before the end of the long duration pulse, capacitior 163 is virtually fully charged. But a change to zero potential at terminal 151 which is connected to the input of inverting gate 155 causes a positive potential at the output of inverting gate 155. This positive potential at the input of inverting gate 157 causes a zero potential at the output of inverting gate 157. This zero potential causes capacitor 163 to begin discharging through resistor 161.

However, at the moment that terminal 151 assumes a zero potential, capacitor 163 is still charged, thus presenting a positive potential to one input of XOR gate 165. Since the other input of XOR gate 165 instantly assumes a zero potential due to its connection with terminal 151, the output of XOR gate 165 assumes a positive potential. This positive potential is transmitted, by connection, to one input of AND gate 153 and one input of AND gate 167. The output of AND gate 153 does not assume a positive potential because its other input assumes the zero potential of terminal 151 to which it is connected. The output of AND gate 167, however, assumes a positive potential because both of its inputs have a positive potential. One input is from the previously mentioned XOR gate 165. The other input is from the output of inverting gate 155 which has a positive output because its input is zero potential. The zero potential input to inverting gate 155 is due to its connection to terminal 151 which has just assumed a zero potential.

The positive output of AND gate 167 and the base of transistor 171 connected to it, turns transistor 171 on which initates the beginning of a short duration pulse across leads 37 and 39. The collector of transistor 171 accepts current from lead 39. Leads 37 and 39 are connected to transformer 21 shown in FIG. 3. The current from lead 39 comes from transformer 21, which in turn comes from the positive 15 voltage source connected into lead 37 as shown on FIG. 2. It is transistor 179 which switches to produce the short duration pulse into transformer 21.

After the output of XOR gate 165 assumed a positive potential in response to terminal 151 assuming a zero potential, the capacitor 163 begins to discharge. Once the capacitor 163 is sufficiently discharged, the inputs to XOR gate 165 both have a zero potential, which causes the output of XOR gate 165 to assume a zero potential. This causes a zero potential at one input of AND gate 165 (as well as AND gate 153) and causes a zero potential at the output of AND gate 167 and the base of transistor 171 to which it is connected. This shuts off transistor 171 to end the pulse switched across leads 37 and 39 which was initiated when incoming variable pulse width signal 11 dropped from positive to zero potential at terminal 151. Again, it is the discharge time of the capacitor 163 which controls the duration of the short duration pulse switched across leads 37 and 39.

Referring to FIG. 3, leads 33 and 35 are electrically connected to the pulse generation cicuit 13 of FIG. 2, previously discussed. A short duration pulse switched across leads 33 and 35 creates a positive potential at lead 35, the dotted primary, and therefore, causes a positive potential at lead 41, the dotted secondary. A positive potential at lead 41 causes current flow through diodes 49 and 51, through resistor 57, and the base of transistor 59. Since the base of transistor 59 is now positively biased, current will flow through transistor 59 and diode 61, and on to the negative 12 volt source. With the small voltage drop within transistor 59 and diode 61, the collector of transistor 59 assumes a potential of about negative 11 volts. Since the base of transistor 83 is linked to the collector of transistor 59 through resistor 79, transistor 83, whose base is now negatively biased, turns on. Once transistor 83 turns on, the collector of transistor 83 and the drain of transistor 89, and thus output 25 assumes a positive 12 volt potential. At this point transistor 89 remains turned off since its gate also has a potential of about negative 11 volts.

As previously stated, the collector of transistor 59 now has a potential of about negative 11 volts. This potential is connected through resistor 65 to a positive volt source having a potential of positive 12 volts. In going from the positive 12 to negative 12 volts, all of the voltage drop occurs through resistor 65 which means that the terminal of resistor 65 not connected to positive 12 volt source will have and maintain a negative 11 volt potential. This negative 11 volt potential is transmitted through resistor 63 to the base of latching transistor 53. The negative potential on the base of PNP latching transistor 53 opens latching transistor 53 to current flow from the grounded emitter of latching transistor 53 through its collector and on through resistor 55 on its way to the negative 12 volt source connected to resistor 55. Opened latch transistor 53 maintains a zero potential at the base of transistor 59 through resistor 57, thus keeping it open, even after the short duration pulse ends. Otherwise, transistor 59 would be shut off. Opened latching transistor 53 in turn keeps the collector of transistor 59 at a minus 11 volt potential via its closed circuit connection with diode 61 and negative 12 voltage source. It is to be noted at this point that transistor 77 is turned off since the negative 12 volt potential at its emitter is equivalent to that of its base by connection with resistor 73.

Referring to the previous operational discussion concerning FIG. 2, as the end of the first variable width pulse 11 is received at terminal 151 of pulse generation circuit 13, a short duration pulse is switched across leads 37 and 39 of transformer 21. Referring to FIG. 3, at the other side of transformer 21, leads 43 and 45 receive the energy from the short duration pulse. In sending the short duration pulse, lead 37 of transformer 21 is positively energized. Since terminals 37 and 43 are the dotted terminals, a positive voltage potential is created at terminal 43 and a negative potential is created at terminal 45. This positive voltage potential is transmitted through diode 69 causing current flow through resistor 71, which has a resistive value of 10,100 ohms and resistor 73 which has a resistive value of 4,300 ohms. The positive voltage drop at resistor 73 causes a positive bias on the base of transistor 77. This opens transistor 77 which allows current flow to the negative 12 volt source which is attached to the emitter of transistor 77. This allows the negative 12 volt potential to become available to the collector of transistor 77 and therefore to the base of transistor 59, to which it is connected, shutting it off.

Once transistor 59 is shut off, there is no further current flow through the collector of transistor 59 from resistor 65 and the positive 12 volt source to diode 61 and the negative 12 volt source. The collector of transistor 59 now assumes the positive 12 volt potential through resistor 65. This positive potential also exists at the base of latching transistor 53, thus shutting it off. The positive potential through resistor 65 also occurs at the gate of transistor 89. The positive potential at the gate of transistor 89, with respect to its negative 12 volt potential at its source causes transistor 89 to open. The opening of transistor 81 exposes the drain of transitor 89 and the collector of transistor 83, and therefore output 25, to the potential of the negative 12 volt source.

The positive 12 volt potential through resistor 65, and resistor 79, also exists at the base of transistor 83. Since the emitter of transistor 83 is also at a positive 12 volts through diodes 87 and 85, transistor 83 is effectively shut off. In this condition, with transistor 89 open and transistor 83 closed, output 25 has a negative 12 volt potential. It is understood that if the source of transistor 89 were grounded that output 25 would now have a zero potential recreating the unipolar characteristic of variable pulse width signal 11, as shown in representation 113 of FIG. 1. The positive and negative voltage sources were used because they represent the best mode to operate the three phase motor illustrated in FIG. 4 and hereinafter described.

Referring to FIG. 4, logic controller 203 is programmed in accordance with the capabilities of three phase brushless motor 231. Variable pulse width power isolation circuits 201a, 201b and 201c take a small potential (usually five volt) signal from logic controller 203 and transform it to a larger potential signal to be applied to field effect transistors 221, 223, and 225 respectively. The logic controller has built into its memory the firing sequence as well as the firing timing with which each phase of three phase brushless motor 231 is to be energized. Within the time period that a phase can be enerzied, logic controller 203 will initiate a pulse signal to variable pulse width power isolation circuit 201a. The duration of this pulse signal will determine the length of time the phase associated with variable pulse width power isolation circuit 201a is to be energized. A short duration input pulse signal translates to a short duration of bias of field effect transistor 221 through resistor 211. This in turn leads to a short duration of energization of one phase of three phase brushless motor 231. Given a constant voltage motor power source 233 to drive a three phase brushless motor 231, in this case a 100 volt battery, the use of variable duration 100 volt pulses is the preferred method of motor control. A rheostat, to control motor power by reducing voltage through a resistance for example, would waste energy unnecessarily in the form of heat dissipated through rheostat resistance. The present method also enables positioning of the three phase brushless motor 231 in quantifiable positions based on number of windings, in situations where position control is paramount.

Therefore, the amount of power received by three phase brushless motor 231 will be proportional to the duration of pulses directed by logic controller 203, across variable pulse width power isolation circuits 201a, 201b and 201c, which pulsingly energize field effect transistors 221, 223 and 225, respectively. FIG. 4 illustrates but one of the many possible applications suitable for the circuit of the present invention. The circuit of the present invention is especially useful in space applications because the transformers used therein can be easily shielded from electromagnetic fields which are more prevalent in the vacuum of space.

While specific embodiments of this circuit have been disclosed in the foregoing description, it is intended that many modifications and adaptations should, and are intended to be comprehended within the meaning and range of this invention, without any such modfications and adaptations causing a departure from the spirit and scope of the invention.

What is claimed is:

1. A variable pulse width transmitting isolation circuit comprising:
    means for receiving a variable pulse width signal and transmitting a first pulse of short duration when said received signal assumes a positive voltage potential and transmitting a second pulse of short duration when said received signal assumes a zero voltage potential;
    inductive transmission means, attached to said means for receiving, for inductively transmitting said first and said second pulse of short duration; and
    switching means, having an output, connected to said inductive transmission means, for assuming a first preselected voltage potential at said output upon receipt of said first pulse of short duration and for maintaining said first preselected voltage potential at said output until said second pulse of short duration is received, and then for assuming and maintaining a second preselected voltage potential until receipt of said first pulse of short duration.

2. The variable pulse width transmitting isolation circuit of claim 1 wherein said means for receiving further comprises a digital logic circuit having one input to receive the variable pulse width signal, a first pair of outputs, a second pair of outputs, and a timing capacitor, connected to said digital logic circuit, responsive to the variable pulse width signal received at said input of said means for receiving to govern the duration of said first and said second pulse of short duration.

3. A pulse transmission isolation circuit comprising:
    a unipolar pulse generator having a first pulse source for indicating a high potential, and a second pulse source for indicating a low potential;
    a first pulse transformer connected to said first pulse source;
    a second pulse transformer connected to said second pulse source; and
    switching means connected to said first and said second pulse transformers to transmit a signal having a relatively high voltage during and after a pulse is received through said first pulse transformer, and a relatively low voltage during and after a pulse is received through said second pulse transformer.

4. A variable pulse width signal transmission/isolation circuit comprising:
    a pulse generator adapted to recive a variable pulse width input signal and to generate and transmit a first short duration pulse signal when said input signal translates from a lower value to a higher value, and to generate and transmit a second short duration pulse signal when said input signal translates from a higher value to a lower value;
    a first pulse transformer, having first and second output leads, connected to said pulse generator to receive and inductively transmit said first short duration pulse signal;
    a second pulse transformer, having first and second output leads, connected to said pulse generator to receive and inductively transmit said second short duration pulse signal;
    a switching circuit connected to said first and second output leads of said first and second pulse transformers, said switching circuit generating an output signal having a first voltage value when said first short duration pulse signal is received, and generating a second voltage value when said second short duration pulse signal is received.

5. A variable pulse width signal transmission/isolation circuit comprising:
    a pulse generator adapted to receive a variable pulse with input signal and to generate and transmit a first short duration pulse signal when said input signal translates from a lower value to a higher value, and to generate and transmit a second short duration pulse signal when said input signal translates from a higher value to a lower value;
    a first pulse transformer, having first and second output leads, connected to said pulse generatior to receive and inductively transmit said first short duration pulse signal;
    a second pulse transformer, having first and second output leads, connected to said pulse generator to receive and inductively transmit said second short duration pulse signal;
    a switching circuit for generating an output signal initiated in resposne to said first short duration pulse signal and terminated in response to said second short duration pulse signal whereby the width of said output signal is the same as the width of said input signal.

6. A pulse signal detection circuit comprising:
    means for receiving an input pulse; and
    means for outputting a short duration pulse, connected to said means for receiving, having a first output for outputting a short duration pulse when the receipt of an input pulse begins, and a second output for outputting a short duration pulse when the receipt of an input pulse ends.

7. The pulse signal detector circuit of claim 6 further comprising:
    inductive transmission means, attached to said first and said second outputs for inductively receiving and retransmitting said short duration pulses, to conductively isolate said pulse signal detector circuit while allowing transmission of said short duration pulses.

8. Apparatus for generating a variable width, relatively high power electrical pulse output signal corresponding to a variable width pulse control signal, having a relatively low voltage base potential comprising:
    a pulse generation circuit having an input receiving said control signal and operable to generate first and second short duration pulses, having a relatively low voltage base potential, corresponding to the initiation and the completion respectively of said control signal;

a first inductive transformer receiving said first short duration pulse and operable to inductively generate a coresponding first, short duration, pulse output signal, having a relatively high voltage base potential, indicative of said initiation of the control signal;

a second inductive transformer receiving said second short duration pulse and operable to inductively generate a coresponding second, short duration pulse output signal, having a relatively high voltage base potential, indicative of said completion of the control signal; and a circuit receiving said first and second output signals and operable in response thereto, to generate a relatively high power, variable pulse width output signal whose pulse width is substantially equal to the pulse width of said control signal.

9. A pulse construction circuit comprising:
an output capable of assuming a first and a second voltage potential;
first short duration pulse receiving means, connected to said output, for directing said output to assume said first voltage potential; and
second short duration pulse receiving means, connected to said output for directing said output to assume said second voltage potential.

10. The pulse construction circuit of claim 9 further comprising inductive transmission means, having an input and an output, said output connected to said first and said second pulse receiving means, for conductively isolating said first and said second pulse receiving means from said input of said inductive transmission means, wherein said input of said inductive transmission means is enabled to receive pulses for inductive transmission to said first and said second pulse receiving means.

11. A process of transmitting a variable width pulse from a low power pulse source to a higher power pulse receiver comprising the steps of:
detecting the input voltage potential of a variable width pulse;
outputting a first short duration pulse in response to the transition from a lower to a higher input voltage potential of said variable width pulse;
inductively transmitting said first short duration pulse;
outputting a high output voltage potential upon receipt of said inductively transmitted said first short duration pulse, and maintaining said high output voltage potential so long as said variable width pulse maintains a high input voltage potential; 16
outputting a second short duration pulse in response to the transition from a higher to a lower input voltage potential of said variable width pulse;
inductively transmitting said second short duration pulse; and
outputting a low output voltage potential, upon receipt of said inductively transmitted said second short duration pulse, and maintaining said low output voltage potential so long as said variable width pulse maintains a low input voltage potential.

12. The process of Step 11 wherein the magnitude of the difference between said high output voltage and said low output voltage is significantly higher than the magnitude of the difference between said high input voltage and said low input voltage.

13. The process of Step 11 wherein at least one of said output voltages are non-positive voltage.

14. A process of transmitting a variable width pulse from a low power pulse source to a higher power pulse receiver comprising the steps of:
detecting the input voltage potential of a variable width pulse;
outputting a first short duration pulse in response to the transmition from a lower to a higher input voltage potential of said variable width pulse;
inductively transmitting said first short duration pulse;
outputting a low output voltage potential, upon receipt of said inductively transmitted said first short duration pulse, and maintaining said low output voltage potential so long as said variable width pulse maintains a high input voltage potential;
outputting a second short duration pulse in response to the transition from a higher to a lower input voltage potential of said variable width pulse;
inductively transmitting said second short duration pulse; and
outputting a high output voltage potential, upon receipt of said inductively transmitted said second short duration pulse, and maintaining said high output voltage potential so long as said variable width pulse maintains a low input voltage potential.

15. A method of generating a relatively high power pulse width modulated output signal corresponding to a relatively low voltage potential pulse width modulated control signal, comprising the steps of:
generating relatively short duration, first and second pulses, of low base potential, corresponding to the initiation and completion of the control signal, respectively;
inductively transforming said first and second pulses into first and second output pulse signals of high base potential and correspondingly short duration, while isolating said low base potential from said high base potential;
initiating a relatively high power pulse width modulated output signal in response to said first output pulse signal; and
terminating said high power pulse width modulated signal in response to said second output pulse signal.

16. A commutation system for a brushless motor comprising:
means for initiating a command for motive action, having a command output, said command in the form of a command pulse delivered to said output having a width proportional to the power to be delivered to said motor;
means for receiving said command pulse, and transmitting short duration pulses in response thereto, having an input connected to said command output of means for initiating a command, and having a first output and a second output, for transmitting a short duration pulse from said first output when said command pulse begins, and transmitting a short duration pulse from said second output when said command pulse ends;
inductive coupling means, connected to said means for receiving, having a first and a second inductive outlet for coupling said short duration pulse from said first output of said means for receiving to said first inductive outlet, and for inductively coupling said short duration pulse from said second output of said means for receiving to said second inductive outlet;

switching means, attached to said inductive coupling means, having an outlet, for switching said outlet to a first predetermined voltage level upon receiving said short duration pulse from said first inductive outlet of said inductive coupling means, and for switching said outlet to a second predetermined voltage level upon receiving said short duration pulse from said second inductive outlet of said inductive coupling means;

voltage potential activated means for switching, having an activation input connected to said outlet of said switching means, and having a current input and current output terminals, said voltage potential activated means for switching to turn on current flow through said current input and output terminals when said activation input attains said first predetermined voltage level, and to shut-off current flow through said current input and output terminals when said activation input attains said second predetermined voltage level;

a power source having a voltage output connected to said current input of said voltage potential activated means for switching;

a brushless motor having an input connected to said current output of said voltage potential activated means for switching, said brushless motor powered by said power source when said means for initiating a command delivers a command pulse to said command output.

17. The system of claim 16 wherein said first predetermined voltage level is positive and said second predetermined voltage level is negative.

18. The system of claim 16 wherein said means for initiating a command is a computer.

19. The system of claim 16 wherein said inductive coupling means comprises a pair of transformers, one for inductively coupling said short duration pulse from said first output of said means for receiving, and the other for inductively coupling said short duration pulse from said second output of said means for receiving.

* * * * *